United States Patent
Yan

(10) Patent No.: US 11,277,103 B2
(45) Date of Patent: Mar. 15, 2022

(54) DIGITAL PREDISTORTION DEVICE AND METHOD

(71) Applicant: SAMSUNG ELECTRONICS CO., LTD., Gyeonggi-do (KR)

(72) Inventor: Jia Yan, Guangdong (CN)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 17/311,851

(22) PCT Filed: Dec. 18, 2019

(86) PCT No.: PCT/KR2019/018016
§ 371 (c)(1),
(2) Date: Jun. 8, 2021

(87) PCT Pub. No.: WO2020/138830
PCT Pub. Date: Jul. 2, 2020

(65) Prior Publication Data
US 2022/0021349 A1 Jan. 20, 2022

(30) Foreign Application Priority Data
Dec. 25, 2018 (CN) .......................... 201811588429.1

(51) Int. Cl.
*H04B 1/62* (2006.01)
*H03F 1/32* (2006.01)
(Continued)

(52) U.S. Cl.
CPC ............ *H03F 1/3241* (2013.01); *H03F 3/21* (2013.01); *H04B 1/0475* (2013.01); *H04B 1/62* (2013.01);
(Continued)

(58) Field of Classification Search
CPC .... H03F 1/3241; H03F 3/21; H03F 2200/451; H04B 1/0475; H04B 1/62; H04B 7/0617; H04B 2001/0408
See application file for complete search history.

(56) References Cited

U.S. PATENT DOCUMENTS 10,931,238 B2 * 2/2021 Megretski ............. H03F 1/3247
2010/0289572 A1 11/2010 Li et al.
(Continued)

FOREIGN PATENT DOCUMENTS

| EP | 3 381 129 | 10/2018 |
| KR | 10-1169880 | 7/2012 |

(Continued)

OTHER PUBLICATIONS

PCT/ISA/210 Search Report issued on PCT/KR2019/018016, dated Mar. 31, 2020, pp. 3.
(Continued)

*Primary Examiner* — Vineeta S Panwalkar
(74) *Attorney, Agent, or Firm* — The Farrell Law Firm, P.C.

(57) ABSTRACT

The disclosure discloses a digital predistortion (DPD) device and method. The DPD device comprises a predistorter configured to obtain a predistortion component from a digital baseband signal using a predistortion parameter and output the predistortion component; and a weighting unit configured to: obtain one or more weighted predistortion components by applying the predistortion component to one or more weighting coefficients, and obtain one or more predistortion correction signals by combining the digital baseband signal and the one or more weighted predistortion components, wherein the one or more weighting coefficients are determined based on the digital baseband signal, the predistortion component, and a synthesized signal in a main
(Continued)

lobe direction obtained by combining radio frequency signals from a beamforming array.

13 Claims, 7 Drawing Sheets

(51) Int. Cl.
  *H03F 3/21* (2006.01)
  *H04B 1/04* (2006.01)
  *H04B 7/06* (2006.01)
(52) U.S. Cl.
  CPC ..... *H04B 7/0617* (2013.01); *H03F 2200/451* (2013.01); *H04B 2001/0408* (2013.01)

(56) References Cited

U.S. PATENT DOCUMENTS

| 2011/0109384 | A1 | | 5/2011 | Brown et al. |
| 2017/0359111 | A1 | | 12/2017 | Shaked |
| 2018/0287569 | A1 | | 10/2018 | Xu et al. |
| 2020/0028476 | A1 | * | 1/2020 | Kim ........................ H03F 3/189 |

FOREIGN PATENT DOCUMENTS

| WO | WO 2017/091119 | 6/2017 |
| WO | WO 2018/067969 | 4/2018 |

OTHER PUBLICATIONS

PCT/ISA/237 Written Opinion issued on PCT/KR2019/018016, dated Mar. 31, 2020, pp. 5.

Brihuega, Alberto et al., "Digital Predistortion in Large-Array Digital Beamforming Transmitters", arXiv:1812.01274v1 [eess.SP] Dec. 4, 2018, pp. 10.

European Search Report dated Nov. 23, 2021 issued in counterpart application No. 19905660.7-1216, 13 pages.

* cited by examiner

[Fig. 1]
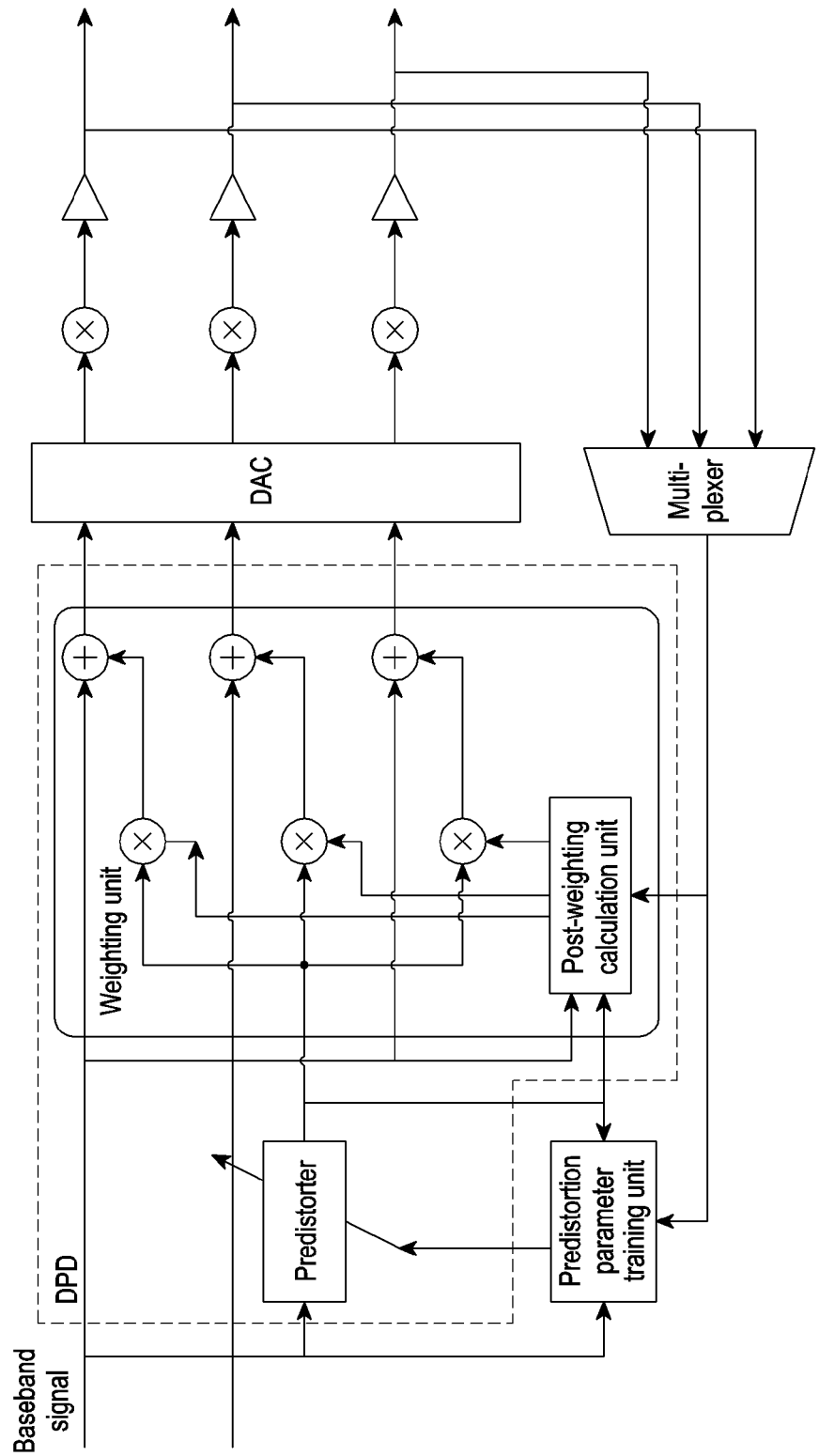

[Fig. 2]
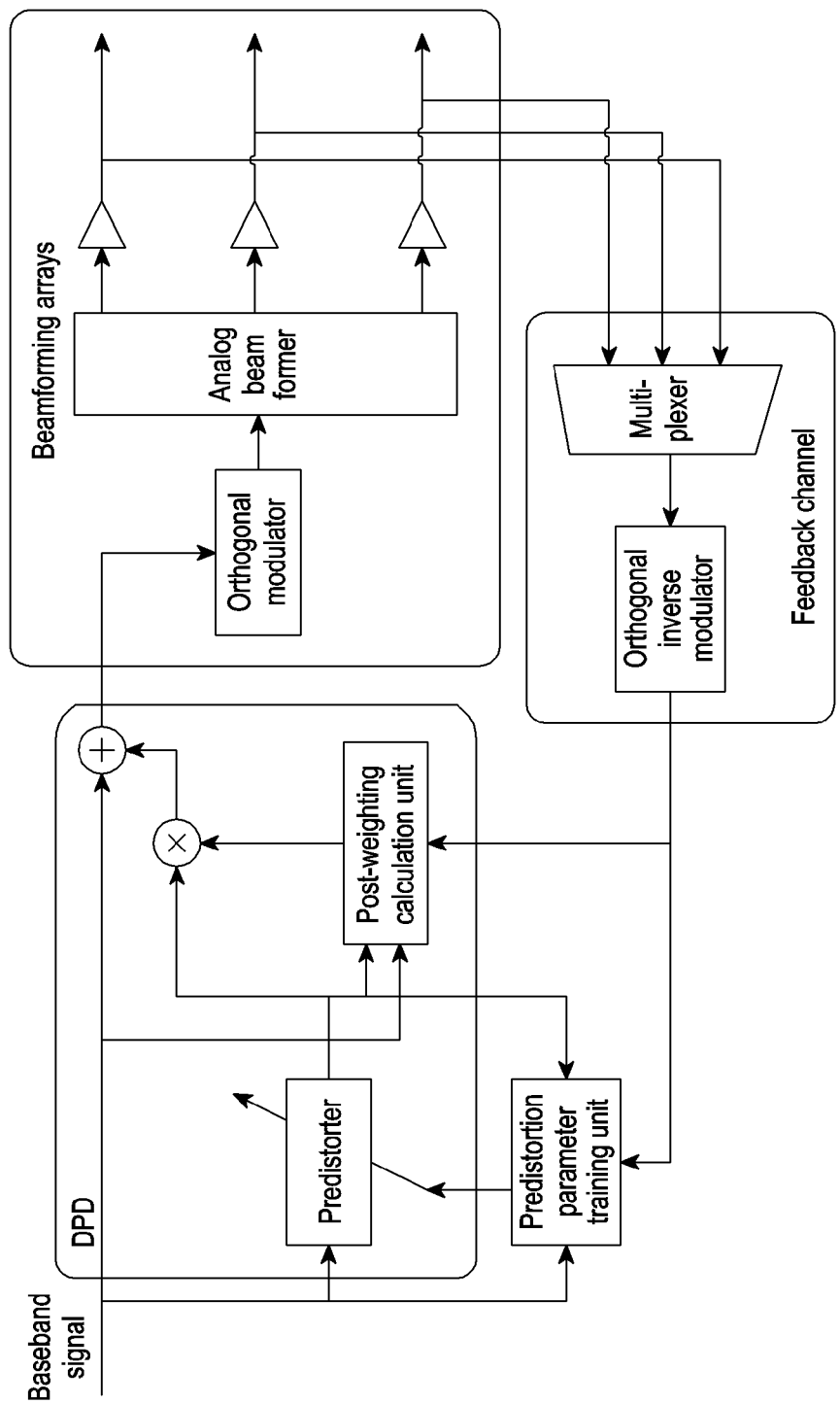

[Fig. 3]
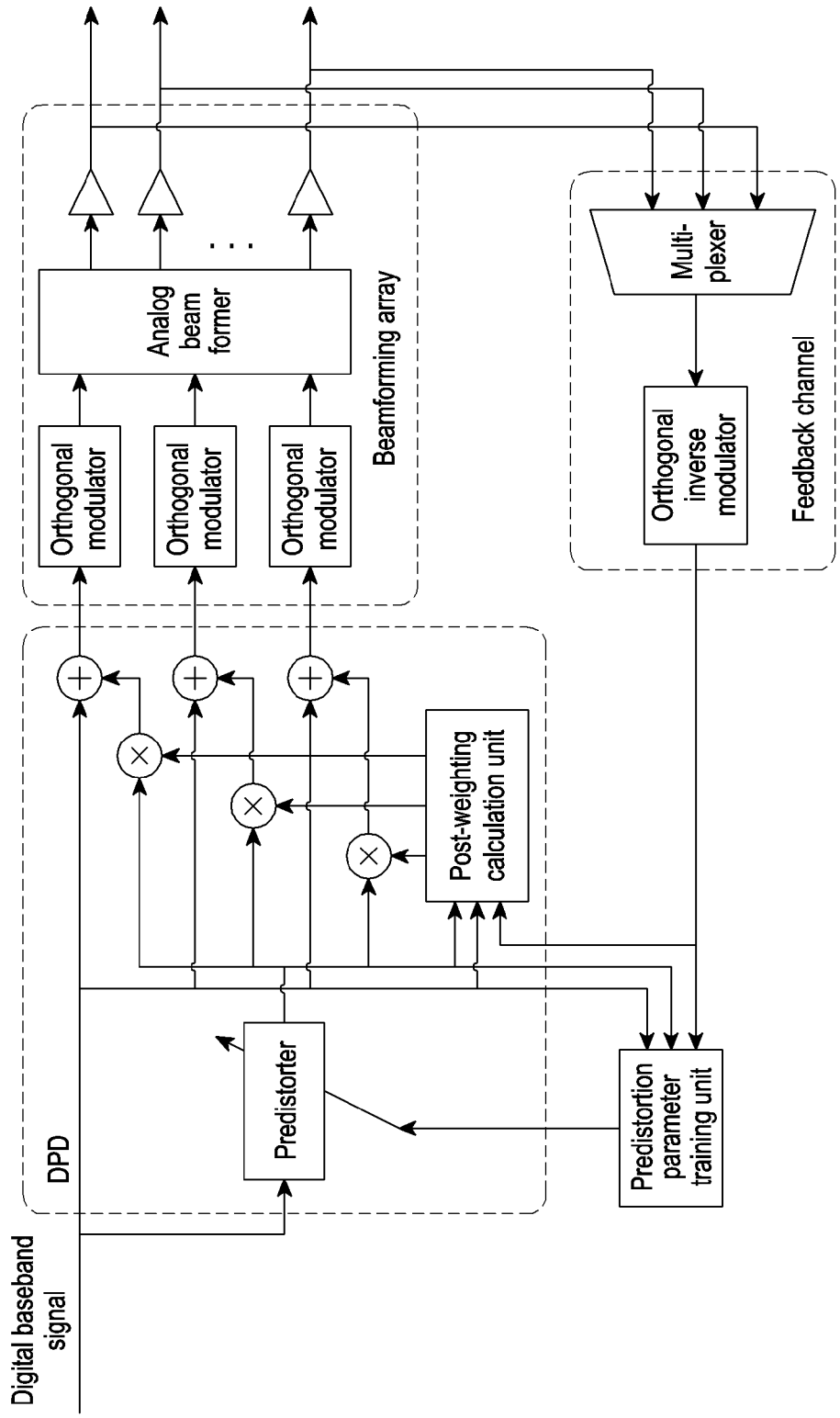

[Fig. 4]
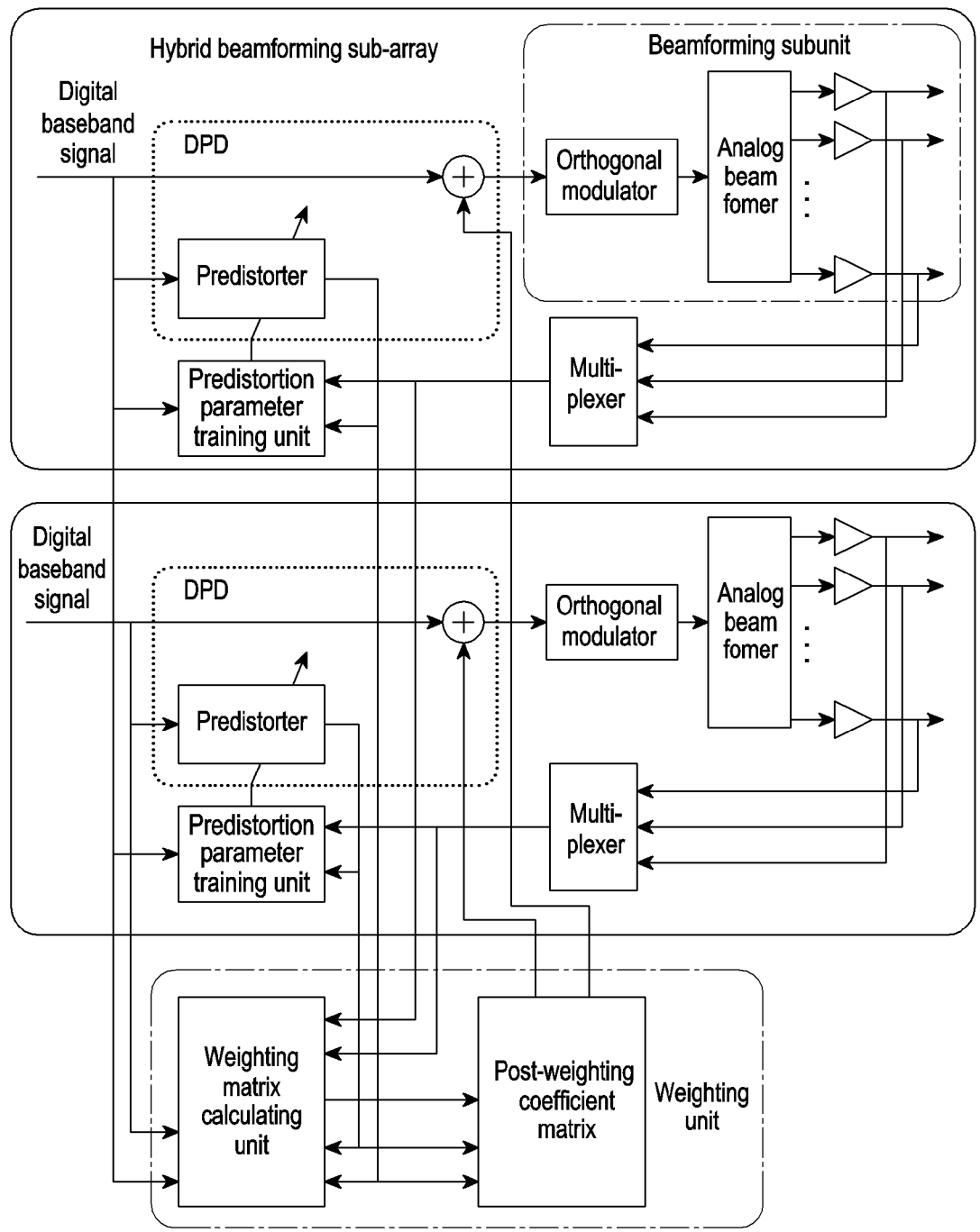

[Fig. 5]
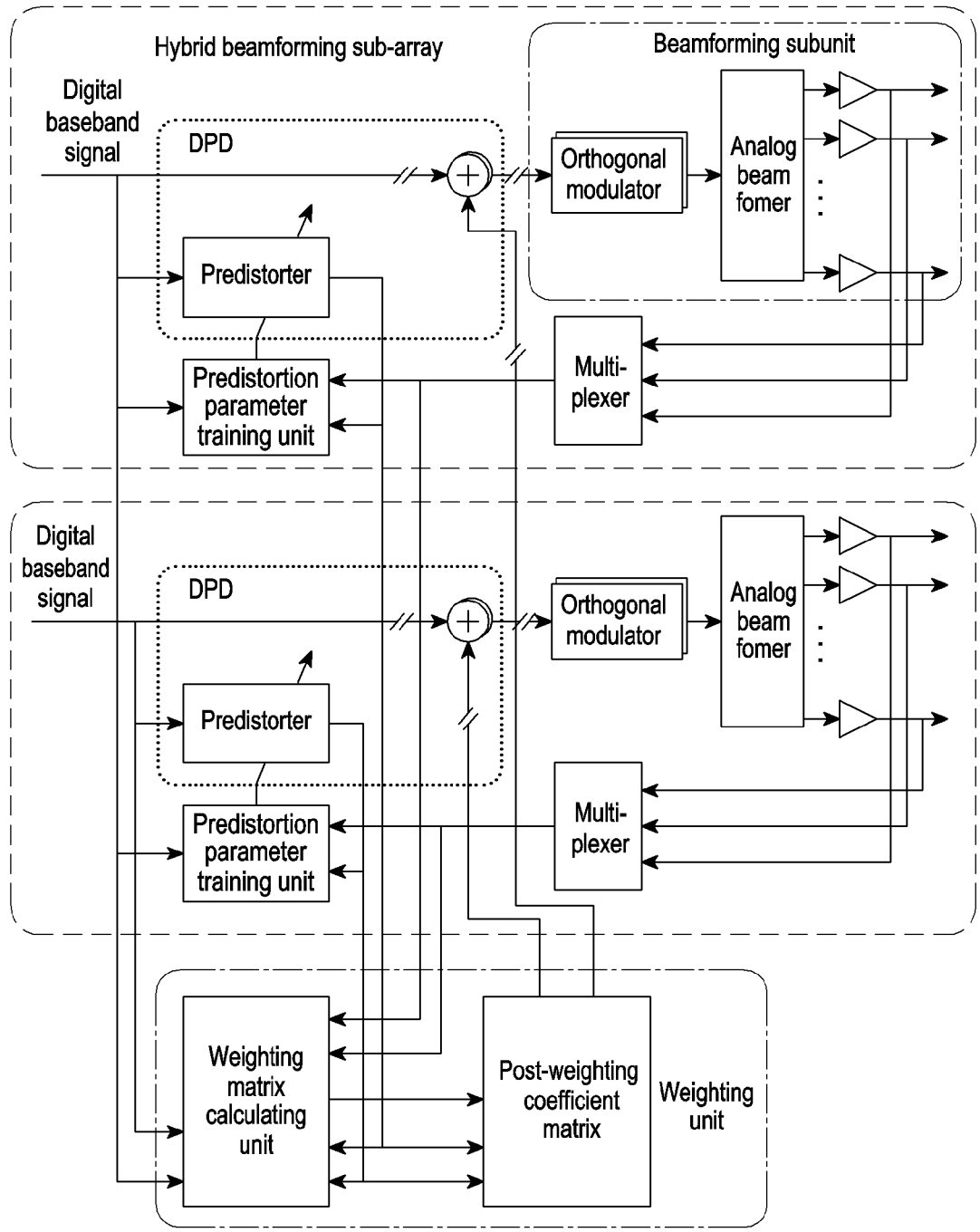

[Fig. 6]
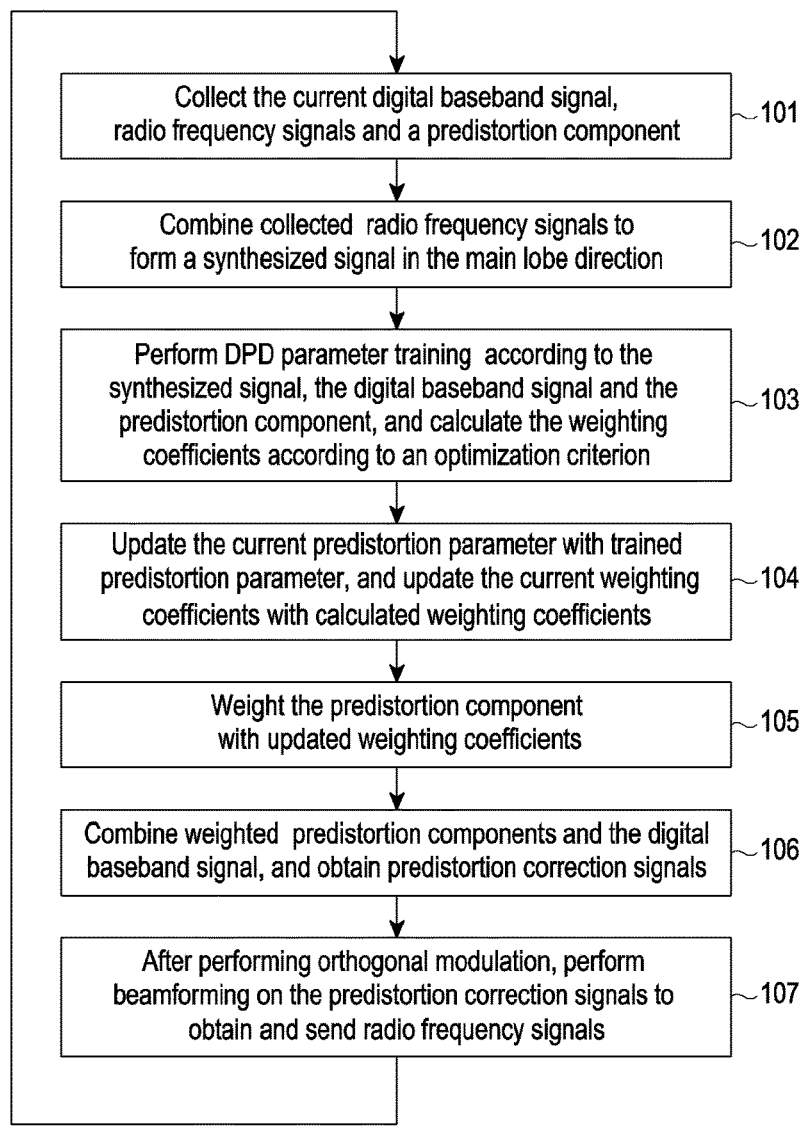
[Fig. 7]
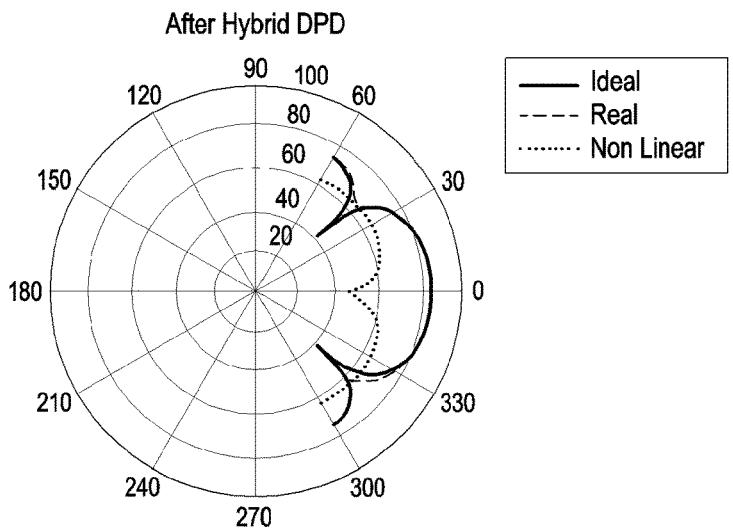

[Fig. 8]
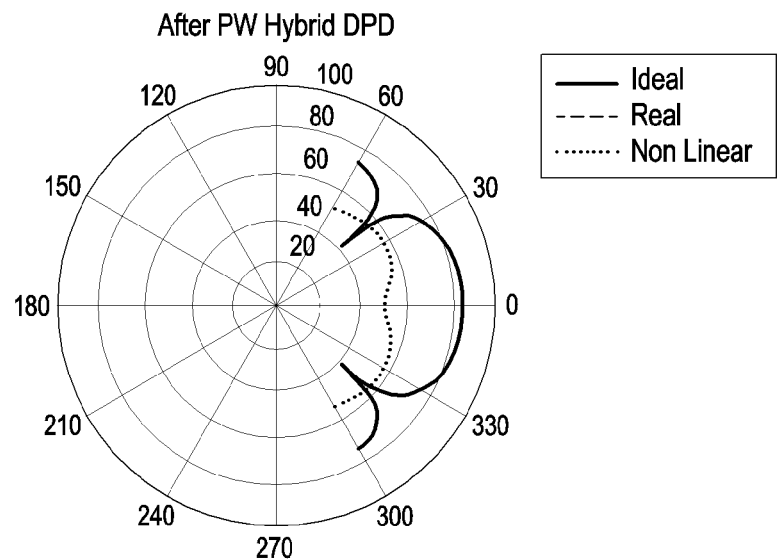
[Fig. 9]
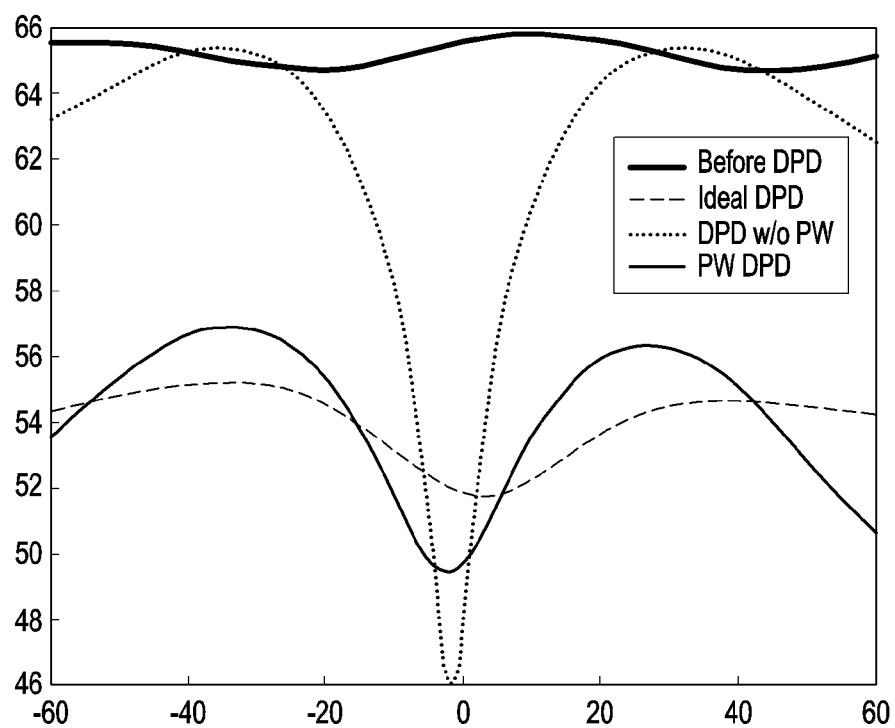

DIGITAL PREDISTORTION DEVICE AND METHOD

PRIORITY

This application is a National Phase Entry of PCT International Application No. PCT/KR2019/018016, which was filed on Dec. 18, 2019 and claims priority to Chinese Patent Application No. 201811588429.1, which was filed on Dec. 25, 2018 in the Chinese Intellectual Property Office, the content of each of which are incorporated herein by reference.

TECHNICAL FIELD

The disclosure relates to wireless digital information processing technologies, and more particularly, to a digital predistortion device and method.

BACKGROUND ART

In 5G or Massive MIMO systems, the hybrid beamforming is a technology to effectively improve spectral efficiency and system throughput. However, this technology has poor performance due to being vulnerable to the influence of the non-linear characteristics of power amplifier (PA) in the base station, so power amplifier linearization technologies are urgently needed. Among them, the digital predistortion (DPD) is the most widely used one.

DISCLOSURE OF INVENTION

Technical Problem

In a traditional digital predistortion technology, every power amplifier is linearized, that is, each power amplifier in the base station is equipped with a digital predistortion module. This architecture is mostly used in 4G LTE systems, and is not suitable for 5G or Massive MIMO systems. This is because a base station in a 5G or Massive MIMO system usually has a large number of power amplifiers. If LTE system solutions are continue used, it will lead to unacceptable calculating and hardware resource consumption, increasing equipment volume and power.

Another method is beam-oriented digital predistortion, which uses a predistortion module to drive multiple power amplifiers. Compared with the LTE system solutions, this method does not linearize each power amplifier, but linearizes the synthetic signal in the main lobe direction of the array beams. The advantage of this method is that it saves the resource consumption of hardware and guarantees the quality of signal received by users in the direction of main lobe of array beams. The disadvantage of this method is that it cannot suppress or even deteriorate the non-linear distortion of side lobe of array beams, thus affecting the coverage of base stations and generating interference between stations and users.

Solution to Problem

The disclosure provide a predistortion method, to reduce the non-linearization distortion of array beams.

The embodiment of the disclosure provides a digital predistortion (DPD) device. The DPD device comprises a predistorter configured to obtain a predistortion component from a digital baseband signal using a predistortion parameter and output the predistortion component; and a weighting unit configured to obtain one or more weighted predistortion components by applying the predistortion component to one or more weighting coefficients, and obtain one or more predistortion correction signals by combining the digital baseband signal and the one or more weighted predistortion components. The one or more weighting coefficients are determined based on the digital baseband signal, the predistortion component, and a synthesized signal in a main lobe direction obtained by combining radio frequency signals from a beamforming array.

The embodiment of the disclosure provides a method for implementing the digital predistortion. The method comprises obtaining a predistortion component from a digital baseband signal using a predistortion parameter; obtaining one or more weighted predistortion components by applying the predistortion component to one or more weighting coefficients; and obtaining one or more predistortion correction signals by combining the digital baseband signal and the one or more weighted predistortion components. The one or more weighting coefficients are determined based on the digital baseband signal, the predistortion component, and a synthesized signal in a main lobe direction obtained by combining radio frequency signals from a beamforming array.

The embodiment of the disclosure provides a DPD device, the DPD processes a digital baseband signal according to a predistortion parameter and obtains a predistortion component, weights the predistortion component with i weighting coefficients and obtains i-channel weighted predistortion components, and respectively combines the digital baseband signal and the i-channel weighted predistortion components and obtains i-channel predistortion correction signals, wherein, the weighting coefficients are calculated based on the digital baseband signal, the predistortion component, and a synthesized signal in the main lobe direction obtained by combining the radio frequency signals; i is a natural number.

In an example, the DPD includes, a predistorter, to process the digital baseband signal according to the predistortion parameter to obtain the predistortion component;

a weighting unit, to weight the predistortion component from the predistorter separately with i weighting coefficients, obtains i-channel weighted predistortion components, and combines the digital baseband signal and the i-channel weighted predistortion components separately to obtain i-channel predistortion correction signals and output the i-channel predistortion correction signals.

In an example, the weighting unit comprises:

a post-weighting calculating unit, to configure the weighting coefficients according to the digital baseband signal, the predistortion component output by the predistorter, and the synthesized signal, a multiplier, to multiply the weighting coefficients with the predistortion component to obtain the weighted predistortion components, an adder, to combine the weighted predistortion components with the digital baseband signal to obtain the predistortion correction signals.

In an example, the post-weighting calculating unit selects the weighting coefficients according to the criterion of minimizing the maximum power value of the non-linear distortion component in other directions except the main lobe direction on the premise of ensuring the quality of the main lobe direction signal, or selects the weighting coefficients according to the criterion of minimizing the sum of the power of the non-linear distortion components in all directions on the premise of ensuring the quality of the main lobe directional signal, or selects the weighting coefficients according to the criterion of minimizing the power of the non-linear distortion component in a fixed direction on the premise of ensuring the quality of the main lobe direction signal.

The number of multipliers is i, and the number of adders is i, i weighting coefficients output by the post-weighting calculating unit are respectively input to i multipliers, i multipliers multiply i weighting coefficients and the predistortion component respectively and output i-channel weighted predistortion components to i adders, i adders adds the i-channel weighted predistortion component and the digital baseband signal respectively, and then output the i-channel predistortion correction signals.

The predistortion parameter is trained by a predistortion parameter training unit according to the digital baseband signal, the predistortion component and the synthesized signal, and is output by the predistortion parameter training unit to the predistorter.

The synthesized signal is obtained by a multiplexer in a feedback channel by combining the radio frequency signals output by power amplifiers in the beamforming array and selecting one channel synthesized signal in the main lobe direction, and the synthesized signal is output to the predistortion parameter training unit and the post-weighting calculating unit.

The post-weighting calculating unit, according to the output d(t) of the predistorter at time t, the weighting coefficient $\gamma_i$ of the $i^{th}$ channel, the analog beamforming coefficient $\omega_i$ of the $i^{th}$ channel, and using the general memory polynomial model, obtains the synthesized signal of the array signal to be transmitted at the azimuth angle θ, which is $$z(t)|_\theta = \sum_i h_i(\theta)\omega_i x(t) + \sum_i h_i(\theta)\omega_i(z_i(t) - x(t) + (\gamma_i - 1)d(t))$$

wherein, I is the total number of channels, $h(\theta) = [h_1(\theta) \ldots h_I(\theta)]^T$ represents the array manifold of the transmitting antenna at the azimuth angle θ, and $z_i(t)$ is the output of the $i^{th}$ transmitting channel at time t; the non-linear distortion in the θ direction is $$z_{NL}(t)|\theta = \sum_i h_i(\theta)\omega_i(z_i(t) - x(t) + (\gamma_i - 1)d(t))$$

according to the maximum power minimization criterion, or the power sum minimization criterion, or the power in a fixed direction minimization criterion, solves $\{\gamma_i\}$ in the non-linear distortion to enable $\{\gamma_i\}$ to meet $\Sigma_i \gamma_i = I$.

The embodiment of the disclosure provides a hybrid beamforming device, comprises:

a DPD for performing predistortion processing on a digital baseband signal, and outputting i-channel predistortion correction signals, a beamforming array for performing analog beamforming on the i-channel predistortion correction signals, and outputting m-channel radio frequency signals, and performing power amplification on the m-channel radio frequency signals respectively, a predistortion parameter training unit for providing a predistortion parameter for the DPD, a feedback channel for combining the m-channel radio frequency signals output by the beamforming array, selecting one channel synthesized signal in the main lobe direction and outputting selected synthesized signal to the predistortion parameter training unit, the DPD processes the digital baseband signal according to the predistortion parameter and obtains a predistortion component, weights the predistortion component with i weighting coefficients and obtains i-channel weighted predistortion components, and respectively combines the digital baseband signal and the i-channel weighted predistortion components and obtains i-channel predistortion correction signals, wherein, the weighting coefficients are calculated based on the digital baseband signal, the predistortion component, and the synthesized signal; i and m are natural numbers.

The embodiment of the disclosure also provides a multi-channel beamforming device, the device comprises:

n hybrid beamforming sub-arrays, to respectively process n-channel digital baseband signals by a DPD and a beamforming subunit in turn, and then transmit processed signals, a weighting unit, to respectively provide i-channel weighted predistortion components for the n hybrid beamforming sub-arrays;

each hybrid beamforming sub-array comprises:

a DPD for performing predistortion processing on a digital baseband signal, and outputting i-channel predistortion correction signals, a beamforming array for performing analog beamforming on the i-channel predistortion correction signals, and outputting m-channel radio frequency signals, and performing power amplification on the m-channel radio frequency signals respectively, a predistortion parameter training unit for providing a predistortion parameter for the DPD, a feedback channel for combining the m-channel radio frequency signals output by the beamforming array, selecting one channel synthesized signal in the main lobe direction and outputting selected synthesized signal to the predistortion parameter training unit;

the DPD respectively combines the digital baseband signal and i-channel weighted predistortion components output by the weighting unit, and obtains the i-channel predistortion correction signals, wherein, the $i^{th}$ weighted predistortion component is obtained by the weighting unit by calculating and obtaining a weighting vector comprising n weighting coefficients according to the digital baseband signal which is input to the beamforming sub-array and the predistortion component from the DPD, and respectively performing weighting on predistortion components from n-channel DPDs; i, m and n are natural numbers.

The weighting unit comprises:

a weighting matrix calculating unit, according to the input n-channel digital baseband signals, the n-channel predistortion components from n hybrid beamforming sub-arrays and the n-channel synthesized signals, obtains the non-linear distortion at azimuth angle θ by using the beamforming and the generalized memory polynomial model:

$$z_{NL|\theta} = h^T(z-Wx) + h^T W(\Gamma - I)d$$

wherein, $h = [h_1^T(\theta) \ldots h_p^T(\theta)]^T$, wherein, $h_p(\theta)$ represents an array manifold of the $n^{th}$ sub-array in θ direction, $z = [z_1^T \ldots z_n^T]^T$, $z_n = [z_{n1} \ldots z_{nM}]^T$, $z_{nm}$ represents the output of the $m^{th}$ power amplifier in the $n^{th}$ sub-array, $z=[x_1 \ldots x_n]^T$, $x_n$ represents the baseband signal of the $n^{th}$ sub-array, $$W = \begin{bmatrix} w_1 & 0 & \cdots & 0 \\ 0 & w_2 & \cdots & \vdots \\ \vdots & \cdots & \ddots & 0 \\ 0 & \cdots & 0 & w_n \end{bmatrix}$$

wherein, $w_n = [\omega_{n1} \ldots \omega_{nM}]^T$, $\omega_{nm}$ represents the simulated beamforming coefficient of the $m^{th}$ antenna in the $n^{th}$ sub-array, $$\Gamma = \begin{bmatrix} \gamma_1^T \\ \vdots \\ \gamma_n^T \end{bmatrix} \text{ is the post-weighting matrix to be solved,}$$

I represents the unit matrix, the post-weighting coefficient matrix unit solves the post-weighting matrix in the non-linear distortion according to the maximum power value minimization criterion, or the power sum minimization criterion, or the power in the fixed direction minimization criterion, to enable $\phi_i$ to meet $h^T(\phi_i) W(\Gamma - I) = 0$ in any main lobe direction, the predistortion component output by the predistorter is weighted respectively with solved post-weighting matrix coefficients, and the weighted predistortion components are output.

The embodiment of the disclosure provides a weighting device for digital predistortion, the weighting device, according to n-channel digital baseband signals, n-channel predistortion components from n hybrid beamforming sub-arrays and n-channel synthesized signals output by the hybrid beamforming sub-arrays each of which respectively combines m-channel radio frequency signals and selects one channel synthesized signal in the main lobe direction for output, calculates and obtains a weighting vector comprising n weighting coefficients, and respectively weights the n-channel predistortion components with i weighting vectors.

The embodiment of the disclosure provides a method for implementing the digital predistortion, the method comprises:

collecting the current digital baseband signal, m-channel radio frequency signals and a predistortion component, combining collected m-channel radio frequency signals to form a synthesized signal in the main lobe direction, performing calculation of i weighting coefficients according to the synthesized signal, the collected digital baseband signal and the predistortion component, weighting the current predistortion component with the i weighting coefficients respectively, and obtaining i-channel weighted predistortion components, combining the digital baseband signal with the i-channel weighted predistortion components respectively, and obtaining i-channel predistortion correction signals;

wherein, i and m are natural numbers.

The embodiment of the disclosure weights the predistortion component based on the digital baseband signal, the predistortion component and the weighting coefficients obtained based on a synthesized signal in the main lobe direction which is obtained by combining the RF signals from the array to redistribute the predistortion component. By flexible selection of the weighting coefficients, the main lobe direction signal of the array beam is ensured and the side lobe signal of the array beam is suppressed. Without introducing additional analog devices, it is beneficial to reduce the area and cost of equipment, and does not require each power amplifier to have similar non-linear characteristics, make the beamforming device have better system performance, increase coverage, reduce station-side interference and user-to-user crosstalk.

BRIEF DESCRIPTION OF DRAWINGS

FIG. 1 is a schematic diagram illustrating a DPD circuit structure according to the disclosure.

FIG. 2 is a schematic diagram illustrating a hybrid beamforming device according to embodiment 1 of the disclosure.

FIG. 3 is a schematic diagram illustrating a hybrid beamforming device according to embodiment 2 of the disclosure.

FIG. 4 is a schematic diagram illustrating a multi-channel beamforming device including a hybrid beamforming sub-array according to embodiment 3 of the disclosure.

FIG. 5 is a schematic diagram illustrating a multi-channel beamforming device including a hybrid beamforming sub-array according to embodiment 4 of the disclosure.

FIG. 6 is a flowchart illustrating a method for implementing the digital predistortion according to an embodiment of the disclosure.

FIG. 7 is a schematic diagram illustrating an array beam pattern formed by un-weighted predistortion in a sub-array composed of three antennas.

FIG. 8 is a schematic diagram illustrating an array beam pattern formed by weighted predistortion in a sub-array composed of three antennas.

FIG. 9 is a schematic diagram illustrating the effect for suppressing non-linear distortion in all directions utilizing non-linearization, pre-improved un-weighted DPD and improved weighted DPD.

MODE FOR THE INVENTION

In order to make objectives, technical solutions and advantages of the disclosure clearer, the disclosure will be described in detail hereinafter with reference to accompanying drawings.

In this application, the predistortion component of each power amplifier is redistributed in a weighted manner by a post-weighting unit, so that the non-linear distortion of side lobes can be suppressed while the quality of a signal in the main lobe direction of the output radio frequency (RF) signal beams of the hybrid beamforming device is guaranteed.

FIG. 1 is a schematic diagram illustrating a DPD circuit structure according to the disclosure. Referring to FIG. 1, a DPD includes a predistorter, a post-weighting calculating unit, multipliers and adders. A digital baseband (BB) signal is input to the predistorter, and the predistorter outputs a predistortion component according to a trained predistortion training parameter output by a predistortion parameter training unit.

A synthesized signal in the main lobe direction is combined by a multiplexer from each RF signal output by a power amplifier. The synthesized signal is input to the predistortion parameter training unit and the post-weighting calculating unit respectively. The predistortion parameter training unit performs predistortion parameter training according to the digital baseband signal, the synthesized signal output by the multiplexer and the predistortion component output by the predistorter.

The post-weighting calculating unit configures i weighting coefficients according to the synthesized signal output by the multiplexer, the predistortion component output by the predistorter and the digital baseband signal respectively, and output i-channel weighting coefficients to be used to perform weighting on the predistortion component respectively to redistribute the predistortion components of i-channel power amplifiers. The i-channel weighted predistortion components are combined with the digital baseband signal to obtain i-channel predistortion correction signals, which are output to a digital-to-analog converter to convert the i-channel predistortion correction digital signals into the i-channel analog radio frequency signals. That is to say, predistortion component and i-channel weighting coefficients are respectively input to i multipliers, every multiplier outputs a weighted predistortion component to one adder, digital baseband signal is input to each adder, and i adders output i-channel predistortion correction signals. Wherein, the number of i is the same as the number of multi-channel RF signals output by the digital-to-analog converter.

The weighting coefficients configured by the post-weighting calculating unit can be selected by different optimization criteria such as the Min-Max optimization or the total power minimization. Min-Max optimization is to select a set of coefficients to minimize the maximum power of the non-linear distortion component in other directions while ensuring the quality of the main lobe direction signal. Total power minimization is to select a set of coefficients to minimize the sum of the power of the non-linear distortion components in all directions while ensuring the quality of the main lobe directional signal. In addition, it can be flexibly adapted to different scenarios by changing the criteria. For example, in some fixed wireless connection scenarios, the criterion can select a set of coefficients to minimize the power of the non-linear distortion component in a fixed direction while ensuring the quality of the main lobe direction signal.

Embodiment 1

FIG. 2 is a schematic diagram illustrating a hybrid beamforming device according to embodiment 1 of the disclosure. Referring to FIG. 2, the device includes a DPD, a beamforming array, a predistortion parameter training unit and a feedback channel. A digital baseband signal is transmitted by an antenna array after passing through the DPD and the beamforming array in turn. The feedback channel collects the RF signal output by each power amplifier in the beamforming array, combines the RF signals to get the synthesized signal of main lobe direction, and feeds back the synthesized signal to the DPD and the predistortion parameter training unit respectively.

The DPD includes a predistorter, a post-weighting calculating unit, a multiplier and an adder. A digital baseband signal is input to the predistorter, and the predistorter outputs a predistortion component according to a trained predistortion training parameter output by the predistortion parameter training unit.

The multiplexer in the feedback channel combines a synthesized signal in the main lobe direction from a radio frequency signal output by each power amplifier in the beamforming array, an orthogonal inverse modulator inversely modulates the synthesized signal and outputs an inverse modulated signal, which is then input to the predistortion parameter training unit and the post-weighting calculating unit respectively. The predistortion parameter training unit performs predistortion parameter training based on the digital baseband signal and the inverse modulated signal output by the orthogonal inverse modulator, and the predistortion components output by the predistorter.

The post-weighting calculating unit performs weighting coefficient configuration according to the inverse modulated signal output by the orthogonal inverse modulator, the predistortion components output by the predistorter and the digital baseband signal. The output weighting coefficients weights the predistortion component to redistribute the predistortion component of the power amplifier. The weighted predistortion component is combined with the digital baseband signal to obtain a predistortion correction signal. The predistortion correction signal is input to the orthogonal modulator in the beamforming array. That is to say, the predistortion component and the weighting coefficient are input to the multiplier, the multiplier outputs a weighted predistortion component to the adder, the digital baseband signal is input to the adder, and the adder outputs a predistortion correction signal to the beamforming array. The weighting coefficients configured by the post-weighting calculating unit can be selected by different optimization criteria such as minimum maximum (Min-Max) optimization or total power minimization. The Min-Max optimization is to select a set of coefficients to minimize the maximum power of the non-linear distortion component in other directions while ensuring the quality of the main lobe direction signal. The total Power Minimization is to select a set of coefficients to minimize the sum of the power of the non-linear distortion components in all directions while ensuring the quality of the main lobe directional signal. In addition, it can be flexibly adapted to different scenarios by changing the criteria. For example, in some fixed wireless connection scenarios, the criterion can select a set of coefficients to minimize the power of the non-linear distortion component in a fixed direction while ensuring the quality of the main lobe direction signal.

The beamforming array includes an orthogonal modulator, an analog beamformer and a power amplifier. The predistortion correction signal output by the DPD is input to the orthogonal modulator, and modulated by the orthogonal modulator, and then a modulated signal is output to the analog beamformer. The analog beamformer converts the input modulated signal into multiple radio frequency signals, and each radio frequency signal is input to each power amplifier for amplification, and then is transmitted through the antenna array.

In this embodiment, by redistributing the predistortion component of the power amplifier, the non-linear distortion of the side lobes can be suppressed while ensuring the quality of the main lobe directional signal, so as to expand the linearization angle, increase the coverage and reduce the interference of an adjacent station.

Embodiment 2

FIG. 3 is a schematic diagram illustrating a hybrid beamforming device according to embodiment 2 of the disclosure. Referring to FIG. 3, the DPD outputs i predistortion correction signals to i orthogonal modulators in the beam forming array respectively. Each of the orthogonal modulators respectively modulates a predistortion correction signal and outputs a modulated signal. I-channel modulated signals are respectively input to the analog beamformer, and after being processed by the analog beamformer, m-channel radio frequency signals are output, and then the m radio frequency signals are amplified by the power amplifier. In which, m and i are natural numbers greater than 1, and i is less than or equal to m. In this example, i=3 is taken as an example.

The feedback channel further includes an orthogonal inverse modulator. The synthesized signal output by the multiplexer is inversely modulated by the orthogonal inverse modulator and then an inverse modulated signal is output to the predistortion parameter training unit and the post-weighting calculating unit respectively.

The post-weighting calculating unit in the DPD performs a weighting coefficient configuration according to the synthesized signal output by the multiplexer, the predistortion component output by the predistorter and the digital baseband signal, and output i-channel weighting coefficients. The i-channel weighting coefficients are utilized to perform weighting on the predistortion components separately to redistribute the predistortion component of each power amplifier. After the i-channel weighted predistortion components are respectively combined with the digital baseband signal, i-channel predistortion correction signals are obtained, i.e., the total of i-channel predistortion correction signals are obtained and respectively output to the beamforming array. In terms of circuit structure, the predistortion component and every of the weighted coefficients are input to each multiplier, every multiplier outputs a weighted predistortion component to one adder, the digital baseband signal is input to every adder, and every adder outputs a predistortion correction signal to the beamforming array. In other words, i multipliers respectively weight the predistortion component, and i adders respectively combine the digital baseband signal and i-channel weighted predistortion components output by the i multipliers, and obtain i predistortion correction signals. Similarly, the weighting coefficients configured by the post-weighting calculating unit can be selected by different optimization criteria such as Min-Max optimization or total power minimization.

The process of weighting calculation is as follows:

Assuming that the output of the predistorter at time t is $d(t)$, and the weighting coefficient of the $i^{th}$ channel is $\gamma_i$, and $\omega_i$ is the analog beamforming coefficient of the $i^{th}$ channel (according to the hybrid beamforming theory $|\omega_i|=1$), by using the general memory polynomial model, the synthesized signal of the array signal to be transmitted at the azimuth angle θ can be obtained as follows:

$$z(t)|_\theta = \sum_i h_i(\theta)\omega_i x(t) + \sum_i h_i(\theta)\omega_i(z_i(t) - x(t) + (\gamma_i - 1)d(t))'$$

wherein I is the total number of channels, $h(\theta) = [h_1(\theta) \ldots h_I(\theta)]^T$ represents the array manifold of the transmitting antenna at the azimuth angle θ, and $z_i(t)$ is the output of the $i^{th}$ transmitting channel at time t (equivalent baseband output of the $i^{th}$ PA). When in the main lobe direction ($\theta=\theta_n$), namely $h_i(\theta_0)\omega_i=1$, if $\Sigma_i\gamma_i=I$, $z(t)|\theta_0$ is the same as the result of the conventional beam steering DPD. Therefore, when different $\{\gamma_i\}$ is selected, as long as the constraint condition $\Sigma_i\gamma_i=I$ is satisfied, the quality of the synthesized signal in the main lobe direction can be guaranteed to be consistent with the conventional beam steering DPD. In order to suppress the non-linear distortion of side lobe signal, $\{\gamma_i\}$ can be obtained by solving the following optimization problems.

Set:

$$z_{NL}(t)|\theta = \sum_i h_i(\theta)\omega_i(z_i(t) - x(t) + (\gamma_i - 1)d(t))$$

represents the non-linear distortion in the θ direction, then:

Mode 1, according to the Min-Max optimization criterion, $$\underset{\{\gamma_i\}}{\text{minimize}} \quad \max\{\|E(z_{NL}(t)|_{\theta_1})\|^2 \cdots \|E(z_{NL}(t)|_{\theta_Q})\|^2\}$$

$$\text{subject to} \quad \sum_i \gamma_i = I$$

In which, $\theta_1 \ldots \theta_Q$ represents different sampling angles.

Mode 2, according to the total power minimization criterion, $$\underset{\{\gamma_i\}}{\text{minimize}} \sum_q \|E(z_{NL}(t)|_{\theta_q})\|^2$$

Mode 3: fixed wireless connection direction optimization criterion $$\underset{\{\gamma_i\}}{\text{minimize}} \quad \|E(z_{NL}(t)|_\phi)\|^2$$

$$\text{subject to} \quad \sum_i \gamma_i = I$$

In this embodiment, by redistributing the predistortion component of each power amplifier, the predistortion correction signal can be input for each orthogonal modulator, so that the non-linear distortion of the side lobes can be suppressed while the quality of the main lobe directional signal is ensured, and then the linearization angle can be expanded, the coverage can be increased and the interference of an adjacent station can be reduced.

Embodiment 3

FIG. 4 is a schematic diagram illustrating a multi-channel beamforming device including a hybrid beamforming sub-array according to embodiment 3 of the disclosure. Referring to FIG. 3, the multi-channel beamforming device includes n hybrid beamforming sub-arrays and a weighting unit for providing weighted predistortion components for the DPD in each hybrid beamforming sub-array. In which, n is larger than the number of signals in the main lobe direction.

One hybrid beamforming sub-array forms one channel. The hybrid beamforming sub-array in any channel includes a DPD, a predistortion parameter training unit, a beamforming subunit and a feedback channel. The DPD includes a predistortioner that pre-distorts the digital baseband signal according to a trained predistortion parameter output by the predistortion parameter training unit to obtain the predistortion component, and an adder that combines the digital baseband signal and the weighted predistortion component to obtain the predistortion correction signal. The beamforming subunit includes an orthogonal modulator that orthogonally modulates the predistortion correction signal from the DPD, an analog beamformer that performs analog beamforming on the modulated signal and outputs multi-channel radio frequency signals, and a power amplifier that amplifies the radio frequency signals respectively. In this embodiment, the number of the orthogonal modulator is 1.

For a hybrid beamforming sub-array in any channel, a digital baseband signal is input to the DPD, and then a predistortion correction signal is output by the DPD to the beamforming subunit, after being processed by the beamforming subunit, radio frequency signals are output and transmitted. The multiplexer in the feedback channel combines a synthesized signal in the main lobe direction from the radio frequency signal output by each power amplifier in the beamforming subunit, and the synthesized signal is input to the predistortion parameter training unit and the weighting unit respectively. The weighting unit calculates the weighted predistortion components according to the digital baseband signal input to the hybrid beamforming sub-array, the predistortion component output by the predistorter in the DPD and the synthesized signal from the multiplexer, and outputs the weighted predistortion components to the adder in the DPD. The predistortion parameter training unit trains the predistortion parameter according to the digital baseband signal, the synthesized signal output by the multiplexer and the predistortion component output by the predistorter.

For the weighting unit, the digital baseband signal from each channel, the predistortion component from the predistorter and the synthesized signal from the multiplexer are input to the weighting unit respectively. The weighting unit selects the weighting coefficients for each channel according to different optimization criteria such as Min-Max optimization or total power minimization, and weights the predistortion component of each channel with the weighting coefficient of the corresponding channel, and obtains the weighted predistortion component of each channel, and outputs the weighted predistortion component of each channel to the adder of the corresponding channel.

In one embodiment, the weighting unit includes a weighting matrix calculating unit and a post-weighting coefficient matrix unit.

Considering the general form of an array consisting of n sub-arrays and M antennas for each sub-array, the post-weighting matrix is an n×n complex matrix. The output at time t of the $n^{th}$ sub-array distortion module is recorded $d_n(t)$. If the post-weighting coefficient (weighting vector) corresponding to the $n^{th}$ sub-array is recorded $\gamma_n$, then after the post-weighting matrix, the output of the DPD module of the $n^{th}$ sub-array is as follows:

$$y_{DPD}(t) = x_n(t) + \gamma_n^T d(t)$$

In which, $x_n(t)$ is the baseband signal of the $n^{th}$ sub-array, vector $$d(t) = [d_1(t) \ldots d_p(t)]^T.$$

The weighting matrix calculating unit, according to the input n-channel digital baseband signals, the n-channel predistortion components from n hybrid beamforming sub-arrays and the n-channel synthesized signals, obtains the non-linear distortion at azimuth angle θ by using the beamforming theory and the generalized memory polynomial model. The non-linear distortion at azimuth angle θ may be obtained as follows by using the beamforming theory and the generalized memory polynomial model.

$$z_{NL|\theta} = h^T(z - Wx) + h^T W(\Gamma - I)d$$

In order to simplify the expression, the time mark t is omitted in above formula. The meanings of the symbols in the formula are as follows:

1. $h = [h_1^T(\theta) \ldots h_p^T(\theta)]^T$, in which, $h_p(\theta)$ represents an array manifold of the $n^{th}$ sub-array in θ direction.
2. $z = [z_1^T \ldots z_n^T]^T$, $z_n = [z_{n1} \ldots z_{nM}]^T$, $z_{nm}$ represents the output of the $m^{th}$ power amplifier in the $n^{th}$ sub-array.
3. $x = [x_1 \ldots x_n]^T$, $x_n$ represents the baseband signal of the $n^{th}$ sub-array.

$$w = \begin{bmatrix} w_1 & 0 & \cdots & 0 \\ 0 & w_2 & \cdots & \vdots \\ \vdots & \cdots & \ddots & 0 \\ 0 & \cdots & 0 & w_n \end{bmatrix} \quad 4$$

In which, $w_n = [\omega_{n1} \ldots \omega_{nM}]^T$, $\omega_{nm}$ represents the simulated beamforming coefficient of the $m^{th}$ antenna in the $n^{th}$ sub-array.

$$\Gamma = \begin{bmatrix} \gamma_1^T \\ \vdots \\ \gamma_n^T \end{bmatrix} \text{ is the post-weighting matrix to be solved.} \quad 5$$

6. I represents the unit matrix.

Considering the multi-beam situation, if there is $h^T(\phi_i)W(\Gamma - I) = 0$ in any main lobe direction $\phi_i$, the quality of synthesized signal in any main lobe direction can be guaranteed to be consistent with that of conventional beam-guided DPD. The matrix Γ can be obtained by the following ways:

Mode 1, Min-Max optimization criterion, $$\underset{\Gamma}{\text{minimize}} \quad \max\{\|E(z_{NL}(t)|_{\theta_1})\|^2 \cdots \|E(z_{NL}(t)|_{\theta_Q})\|^2\}$$

$$\text{subject to} \quad h^T(\phi_i)W(\Gamma - I) = 0 \; \forall \, i = 1 \cdots I$$

In which, $\theta_1 \ldots \theta_Q$ represents different sampling angles, I represents the total number of beams.

Mode 2, total power minimization criterion, $$\underset{\Gamma}{\text{minimize}} \quad \sum_q \|E(z_{NL}(t)|_{\theta_q})\|^2$$

$$\text{subject to} \quad h^T(\phi_i)W(\Gamma - I) = 0 \; \forall \, i = 1 \cdots I$$

Mode 3: fixed wireless connection direction optimization criterion $$\underset{\Gamma}{\text{minimize}} \quad \|E(z_{NL}(t)|_{\psi})\|^2$$

$$\text{subject to} \quad h^T(\phi_i)W(\Gamma - I) = 0 \; \forall \, i = 1 \cdots I$$

Based on this, the post-weighting coefficient matrix unit solves the post-weighting matrix in the non-linear distortion according to the maximum power value minimization criterion, or the power sum minimization criterion, or the power in the fixed direction minimization criterion, to enable $\phi_i$ to meet $h^T(\phi_i)W(\Gamma - I) = 0$ in any main lobe direction, and then n*i weighting vectors will be obtained. Each weighting vector includes n weighting coefficients. The weighting vectors are the post-weighting matrix coefficients. The predistortion component output by the predistorter in every hybrid beamforming sub-array is weighted respectively, and the weighted predistortion components are output. Thus, the post-weighting output of each channel is the weighted combination of all n-channel predistortion components.

In this embodiment, by redistributing the predistortion component of the power amplifier in each channel, the non-linear distortion of the side lobe can be suppressed while the quality of the main lobe direction signal in each channel is ensured, so as to expand the linearization angle, increase the coverage area and reduce the interference of an adjacent station.

Embodiment 4

FIG. 5 is a schematic diagram illustrating a multi-channel beamforming device including a hybrid beamforming sub-array according to embodiment 4 of the disclosure. Referring to FIG. 5, the multi-channel hybrid beamforming device includes N hybrid beamforming sub-arrays. As an example, any hybrid beamforming sub-array has i adders, i orthogonal modulators, and a weighting unit that provides i-channel weighted predistortion components for the DPD in each hybrid beamforming sub-array. N is the natural number larger than the number of signals in the main lobe direction, i is the natural number greater than 1, and when i is 1, the device corresponds to that in embodiment 3.

One hybrid beamforming sub-array forms one channel. The hybrid beamforming sub-array in any channel includes a DPD, a predistortion parameter training unit, a beamforming subunit and a feedback channel. The DPD includes a predistortioner that performs predistortion processing on the digital baseband signal according to a trained predistortion parameter output by the predistortion parameter training unit to obtain the predistortion component, and adders that respectively combine the digital baseband signal and i-channel weighted predistortion components to obtain i-channel predistortion correction signals. For example, the DPD includes corresponding i adders. The beamforming subunit includes orthogonal modulators that respectively orthogonally modulate the i-channel predistortion correction signals from the DPD, and obtain i-channel modulated signals. For example, the beamforming subunit includes corresponding i orthogonal modulators; an analog beamformer that performs analog beamforming on the i-channel modulated signals and outputs multi-channel radio frequency signals, and a power amplifier that amplifies the radio frequency signals respectively.

For a hybrid beamforming sub-array in any channel, a digital baseband signal is input to the DPD, and then i-channel predistortion correction signals are output by the DPD to the beamforming subunit, after being processed by the beamforming subunit, radio frequency signals are output and transmitted. The multiplexer in the feedback channel combines a synthesized signal in the main lobe direction from the radio frequency signal output by each power amplifier in the beamforming subunit, and the synthesized signal is input to the predistortion parameter training unit and the weighting unit respectively. The weighting unit respectively calculates i-channel weighted predistortion components according to the digital baseband signal input to the hybrid beamforming sub-array, the predistortion component output by the predistorter in the DPD and the synthesized signal from the multiplexer, and outputs i-channel weighted predistortion components to the adders in the DPD. For example, the weighting unit may respectively output i-channel weighted predistortion components to i adders. The predistortion parameter training unit trains the predistortion parameter according to the digital baseband signal, the synthesized signal output by the multiplexer and the predistortion component output by the predistorter.

For the weighting calculating unit, the digital baseband signal from each channel, the predistortion component output by the predistorter and the synthesized signal output by the multiplexer are input to the weighting unit respectively. The weighting unit calculates and obtains n*i weighting vectors, each weighting vector includes n-channel weighting coefficients. The weighting vectors are the post-weighting matrix coefficients. N predistortion components are weighted respectively utilizing the post-weighting matrix coefficients, and i-channel weighted predistortion components of each channel are obtained and output to the adder in the corresponding channel. Thus, the post-weighting output of each channel is the weighted combination of all n-channel predistortion components. In terms of the number of inputs and outputs of the weighting calculating unit, there are n*3 input signals and n*i output signals.

The specific calculation of the weighting unit is the same as that of the embodiment 4, and will not be repeated.

In this embodiment, by redistributing the predistortion component of each power amplifier in each channel, the non-linear distortion of the side lobe can be suppressed while the quality of the main lobe direction signal in each channel is ensured, so as to expand the linearization angle, increase the coverage area and reduce the interference of an adjacent station.

The application further provides a method for implementing the digital predistortion.

As shown in FIG. 6, FIG. 6 is a flowchart illustrating a method for implementing the digital predistortion according to an embodiment of the disclosure.

Block 101, the current digital baseband signal, m-channel radio frequency signals output by the hybrid beamforming device and a predistortion component are collected, m is a natural number.

Block 102, collected m-channel radio frequency signals are combined to form a synthesized signal in the main lobe direction. If m is 1, the signal whose beam is in the main lobe direction in the radio frequency signal is used as a synthesized signal.

Block 103, the predistortion parameter are trained according to the synthesized signal, the collected current digital baseband signal and the predistortion component, and the weighting coefficients are selected according to different optimization criteria such as Min-Max optimization or total power minimization. In addition, it can be flexibly adapted to different scenarios by changing the criteria. For example, in some fixed wireless connection scenarios, the criterion can select a set of coefficients to minimize the power of the non-linear distortion component in a fixed direction while ensuring the quality of the main lobe direction signal. The number of selected weighting coefficients is the same as the number of signals to be predistortion corrected. For example, if the input signal (i.e., predistortion correction signal) input to the hybrid beamforming device has I channel, the number of weighting coefficients is i.

Block 104, the current predistortion parameter is updated with trained predistortion parameter, and the current weighting coefficients is updated with obtained weighting coefficients.

Block 105, the current predistortion component is weighted with the weighting coefficients calculated in block 103.

In this block, the first predistortion component can also be obtained from the updated (trained) predistortion parameter, and the first predistortion component can be weighted with the updated weighting coefficients (i.e., the weighting coefficient calculated in block 103) to obtain better system performance.

Block 106, the weighted first predistortion components are combined with the current digital baseband signal, and the predistortion correction signals are obtained.

Block 107, orthogonal modulation, analog beamforming and power amplification are performed on the predistortion correction signals in turn to obtain m-channel radio frequency signals, which are transmitted through antenna arrays.

Return to block 101 for the next round of updates to track the changes of the system over time.

In the embodiments of this application, when the weighting coefficients are all 1, each embodiment is equivalent to the traditional beam-oriented digital predistortion. Therefore, the weighting coefficients are set to 1 when the DPD is abnormal, thereby increasing the robustness of the system.

To better illustrate the improvement effect of the embodiments of the disclosure, referring to FIGS. 7 and 8. FIG. 7 is a schematic diagram illustrating an array beam pattern formed by un-weighted predistortion in a sub-array composed of three antennas, and FIG. 8 is a schematic diagram illustrating an array beam pattern formed by weighted predistortion in a sub-array composed of three antennas. The solid line represents the ideal undistorted array beam, the black dotted line represents the array beam formed by the linearization of the power amplifier, and the gray dot dash line represents the power of the non-linear distortion component in all directions. As can be seen from the above figures, after post-weighting processing, the quality of signal not only in main lobe direction, but also in other directions has been improved, and the beam zero has been restored.

As shown in FIG. 9, FIG. 9 is a schematic diagram illustrating the effect for suppressing non-linear distortion in all directions utilizing non-linearization, pre-improved un-weighted DPD and improved weighted DPD. It can be seen that the beam-guided digital predistortion can suppress the non-linear distortion only in the main lobe direction accessory (0 degree angle), but it even worsens in other directions. However, the post-weighting digital predistortion can suppress the distortion at all angles.

The foregoing description is only preferred embodiments of the disclosure and is not used for limiting the protection scope thereof. Any modification, equivalent substitution, or improvement made without departing from the spirit and principle of the disclosure should be covered by the protection scope of the disclosure.

The invention claimed is:

1. A digital predistortion (DPD) device, comprising:
a predistorter configured to obtain a predistortion component from a digital baseband signal using a predistortion parameter and output the predistortion component; and
a weighting unit configured to:
obtain one or more weighted predistortion components by applying the predistortion component to one or more weighting coefficients, and
obtain one or more predistortion correction signals by combining the digital baseband signal and the one or more weighted predistortion components,
wherein the one or more weighting coefficients are determined based on the digital baseband signal, the predistortion component, and a synthesized signal in a main lobe direction obtained by combining radio frequency signals from a beamforming array.

2. The DPD device of claim 1, wherein the weighting unit comprises:

a post-weighting calculating unit configured to determine the one or more weighting coefficients based on the digital baseband signal, the predistortion component, and the synthesized signal,
at least one multiplier configured to obtain the one or more weighted predistortion components by multiplying the one or more weighting coefficients with the predistortion component, and
at least one adder configured to obtain the one or more predistortion correction signals by combining the digital baseband signal and the one or more weighted predistortion components.

3. The DPD device of claim 2, wherein the post-weighting calculating unit is configured to:
select the one or more weighting coefficients based on a criterion of minimizing a maximum power value of a non-linear distortion component in other directions except the main lobe direction, or select the one or more weighting coefficients based on a criterion of minimizing a sum of power values of non-linear distortion components in all directions, or
select the one or more weighting coefficients based on a criterion of minimizing a power value of a non-linear distortion component in a fixed direction.

4. The DPD device of claim 1, wherein the predistortion parameter is trained by a predistortion parameter training unit based on the digital baseband signal, the predistortion component and the synthesized signal, and the trained predistortion parameter is output by the predistortion parameter training unit to the predistorter.

5. The DPD device of claim 4, wherein the synthesized signal is obtained by a multiplexer in a feedback channel by combining the radio frequency signals output by power amplifiers in the beamforming array and selecting one channel synthesized signal in the main lobe direction, and the synthesized signal is output to the predistortion parameter training unit and the post-weighting calculating unit.

6. The DPD device of claim 2, wherein the post-weighting calculating unit, based on an output d(t) of the predistorter at time t, a weighting coefficient $\gamma_i$ of an $i^{th}$ channel, an analog beamforming coefficient $\omega_i$ of the $i^{th}$ channel, and using a general memory polynomial model, obtains the synthesized signal of an array signal to be transmitted at an azimuth angle $\theta$, which is $$z(t)|_\theta = \sum_i h_i(\theta)\omega_i x(t) + \sum_i h_i(\theta)\omega_i(z_i(t) - x(t) + (\gamma_i - 1)d(t))$$

wherein, I is a total number of channels, $h(\theta)=[h_1(\theta) \ldots h_I(\theta)]^T$ represents an array manifold of a transmitting antenna at the azimuth angle $\theta$, and $z_i(t)$ is an output of the $i^{th}$ channel at the time t; the non-linear distortion in a direction of the azimuth angle $\theta$ is $$z_{NL}(t)|\theta = \sum_i h_i(\theta)\omega_i(z_i(t) - x(t) + (\gamma_i - 1)d(t))$$

$\{r_i\}$ in a non-linear distortion to meet $\tau_i\gamma_i=I$.

7. A method for implementing the digital predistortion, the method comprises:
obtaining a predistortion component from a digital baseband signal using a predistortion parameter;

obtaining one or more weighted predistortion components by applying the predistortion component to one or more weighting coefficients; and obtaining one or more predistortion correction signals by combining the digital baseband signal and the one or more weighted predistortion components, wherein the one or more weighting coefficients are determined based on the digital baseband signal, the predistortion component, and a synthesized signal in a main lobe direction obtained by combining radio frequency signals from a beamforming array.

8. The method of claim 7, wherein the one or more weighting coefficients is determined based on the digital baseband signal, the predistortion component, and the synthesized signal.

9. The method of claim 7, wherein applying the predistortion component to the one or more weighting coefficients comprises multiplying the one or more weighting coefficients with the predistortion component.

10. The method of claim 7, wherein the one or more weighting coefficients is selected based on one of a first criterion, a second criterion, and a third criterion, wherein the first criterion is a criterion of minimizing a maximum power value of a non-linear distortion component in other directions except the main lobe direction, wherein the second criterion is a criterion of minimizing a sum of power values of non-linear distortion components in all directions, and wherein the third criterion is a criterion of minimizing a power value of a non-linear distortion component in a fixed direction.

11. The method of claim 7, wherein the predistortion parameter is trained based on the digital baseband signal, the predistortion component and the synthesized signal.

12. The method of claim 11, wherein the synthesized signal is obtained by combining the radio frequency signals output by power amplifiers in the beamforming array and selecting one channel synthesized signal in the main lobe direction.

13. The method of claim 7, wherein, based on an output d(t) of a predistorter that obtains the predistortion component at time t, a weighting coefficient $\gamma_i$ of an $i^{th}$ channel, an analog beamforming coefficient $\omega_i$ of the $i^{th}$ channel, and using a general memory polynomial model, the synthesized signal of an array signal to be transmitted at an azimuth angle $\theta$ is obtained as follows $$z(t)|_\theta = \sum_i h_i(\theta)\omega_i x(t) + \sum_i h_i(\theta)\omega_i(z_i(t) - x(t) + (\gamma_i - 1)d(t))$$

wherein, I is a total number of channels, $h(\theta)=[h_1(\theta) \ldots h_I(\theta)]^T$ represents an array manifold of a transmitting antenna at the azimuth angle $\theta$, and $z_i(t)$ is an output of the $i^{th}$ channel at the time t; the non-linear distortion in a direction of the azimuth angle $\theta$ is $$z_{NL}(t)|\theta = \sum_i h_i(\theta)\omega_i(z_i(t) - x(t) + (\gamma_i - 1)d(t))$$

$\{r_i\}$ in a non-linear distortion to meet $\Sigma_i \gamma_i = I$.

* * * * *